United States Patent
Shibata et al.

(10) Patent No.: US 7,339,247 B2
(45) Date of Patent: Mar. 4, 2008

(54) SEMICONDUCTOR DEVICE MANUFACTURING METHOD AND SEMICONDUCTOR MANUFACTURING APPARATUS

(75) Inventors: Takeshi Shibata, Tsukuba (JP); Hisanori Misawa, Tokyo (JP); Kyoichi Suguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 29 days.

(21) Appl. No.: 11/488,849

(22) Filed: Jul. 19, 2006

(65) Prior Publication Data

US 2006/0263704 A1    Nov. 23, 2006

Related U.S. Application Data

(62) Division of application No. 10/743,003, filed on Dec. 23, 2003, now Pat. No. 7,094,612.

(30) Foreign Application Priority Data

Dec. 26, 2002    (JP)    ............................. 2002-375979

(51) Int. Cl.
*H01L 31/0232* (2006.01)
(52) U.S. Cl. .......................................... 257/435; 430/5
(58) Field of Classification Search ................ 257/435; 430/5
See application file for complete search history.

(56) References Cited

U.S. PATENT DOCUMENTS 3,993,509 A    11/1976    McGinty
4,871,919 A    10/1989    Donohue et al.
6,770,402 B2    8/2004    Suguro et al.

FOREIGN PATENT DOCUMENTS

| JP | 01-282818 | 11/1989 |
| JP | 9-283411 | 10/1997 |
| JP | 10-144249 | 5/1998 |
| JP | 2002-203806 | 7/2002 |

OTHER PUBLICATIONS

Notification for Filing Opinion from the Korean Intellectual Property Office, dated Jul. 19, 2005, in Patent Application No. 10-2003-96719 and English translation thereof.

Office Action from the Taiwan Intellectual Property Office dated Mar. 3, 2005 in Taiwanese Patent Application No. 092135566, and English translation.

*Primary Examiner*—David W. Coleman
(74) *Attorney, Agent, or Firm*—Finnegan, Henderson, Farabow, Garrett & Dunner, L.L.P.

(57) ABSTRACT

A method of manufacturing a semiconductor device is disclosed, which comprises setting a stencil mask above a substrate to be processed in confronting to the substrate, the stencil mask having an opening, and irradiating the substrate with charged particles through the opening of the stencil mask, while adjusting a potential difference between the stencil mask and the substrate depending on a value of a current flowing between the substrate and the stencil mask.

5 Claims, 1 Drawing Sheet

SEMICONDUCTOR DEVICE MANUFACTURING METHOD AND SEMICONDUCTOR MANUFACTURING APPARATUS

CROSS-REFERENCE TO RELATED APPLICATIONS

This application is based upon and claims the benefit of the priority from the prior Japanese Patent Application No. 2002-375979, filed Dec. 26, 2002, and this application is a divisional of application Ser. No. 10/743,003, filed Dec. 23, 2003, now U.S. Pat. No. 7,094,612. The entire contents of these applications are incorporated herein by reference in their entirety.

BACKGROUND OF THE INVENTION

1. Field of the Invention

The present invention relates to a method of manufacturing a semiconductor device using, for example, a stencil mask as a transfer mask and an apparatus for manufacturing the semiconductor device.

2. Description of the Related Art

There has been known a method in which in semiconductor device manufacturing process, a stencil mask having a predetermined pattern is set above a substrate to be processed at a predetermined distance and charged particles such as electrons or ions are projected onto the substrate through openings defining the pattern of the stencil mask. In the method, charged particles (ion beam) such as ions accelerated from a particle source by a predetermined energy pass through a scanner and a magnet to be formulated into a patterned ion beam. The patterned ion beam is projected onto the substrate through the openings formed in the stencil mask. The substrate to be processed mentioned here is a semiconductor substrate, on the surface of which a semiconductor device is to be formed or has been formed, not shown.

There is a disadvantage that, when a substrate is processed using the charged particles, residue charges are accumulated on the substrate so that the semiconductor device formed on the substrate may be destroyed by being charged due to the accumulated charges. A conventional method is known to overcome this disadvantage (Jpn. Pat. Appln. KOKAI Publication No. 9-283411, see page 4). In this method, secondary electrons or plasma electrons are generated to neutralize the accumulated charges, thus preventing the destruction of a substrate due to the accumulated charges.

Jpn. Pat. Appln. KOKAI Publication No. 2002-203806 (FIGS. 29 and 35) discloses a method of controlling the amount of charges accumulated on a substrate to be processed. In the method, a distance and a potential difference between a stencil mask and the substrate to control the amount of charges accumulated on the substrate. The controlling of the amount of charges is carried out by providing a power supply between the stencil mask and the substrate, or by providing a power supply between the stencil mask and the ground and also another power supply between the substrate and ground.

However, neutralizing the accumulated charges by generating secondary electrons or plasma electrons is sensitive to the amount of charges on the substrate and the stencil mask, the amount of energy on charged particles, degree of vacuum in the apparatus, etc., and the amount of neutralized charges greatly changes depending on these factors. As a result, with the method of neutralizing the accumulated charges by generating secondary electrons or plasma electrons, the neutralized charge amount may be insufficient or an excessive amount of electrons may be supplied to cause negative charging, which possibly destroy the semiconductor devices. Further, the charge neutralizing mechanism, which generates the secondary electrons or plasma electrons, is complicated in structure.

On the other hand, according to the method of controlling the amount of the charges accumulated on the substrate by changing a distance and a potential difference between the stencil mask and the substrate, yield is improved. However, it is necessary to set up the distance and the potential difference between the stencil and the substrate before an ion implantation process is carried out. There is no problem if the irradiation condition of the charged particles is stable and the state of the apparatus is stable during the processing. However, if the apparatus is unstable, and the irradiation amount (current amount) of the charged particles per unit time changes during the processing, the neutralized charge amount may be insufficient, or an excessive amount of electrons may be supplied to cause negative charging, which leas to a possible destruction of the semiconductor devices.

BRIEF SUMMARY OF THE INVENTION

According to an aspect of the present invention, there is provided a method of manufacturing a semiconductor device comprising:

setting a stencil mask above a substrate to be processed in confronting to the substrate, the stencil mask having an opening; and irradiating the substrate with charged particles through the opening of the stencil mask, while adjusting a potential difference between the stencil mask and the substrate depending on a value of a current flowing between the substrate and the stencil mask.

According to another aspect of the present invention, there is provided a method of manufacturing a semiconductor device comprising:

setting a stencil mask above a substrate to be processed in confronting with the substrate, the stencil mask having an opening; and irradiating the substrate with charged particles through the opening of the stencil mask, while adjusting a potential difference between the stencil mask and the substrate depending on a ratio between a value of a current flowing in the substrate and a value of a current flowing in the stencil mask.

According to a further aspect of the present invention, there is provided a manufacturing apparatus of a semiconductor device, comprising:

a stencil mask set above a substrate to be processed in confronting to the substrate, the stencil mask having an opening;

a particle source which irradiates the substrate to be processed with charged particles through the opening of the stencil mask;

a first power supply which is connected to the stencil mask and changes a potential of the stencil mask; and a first ammeter connected to the substrate to be processed.

DETAILED DESCRIPTION OF THE INVENTION

Hereinafter, embodiments of the present invention will be described in detail with reference to the accompanying drawings.

First Embodiment

Figure 1:
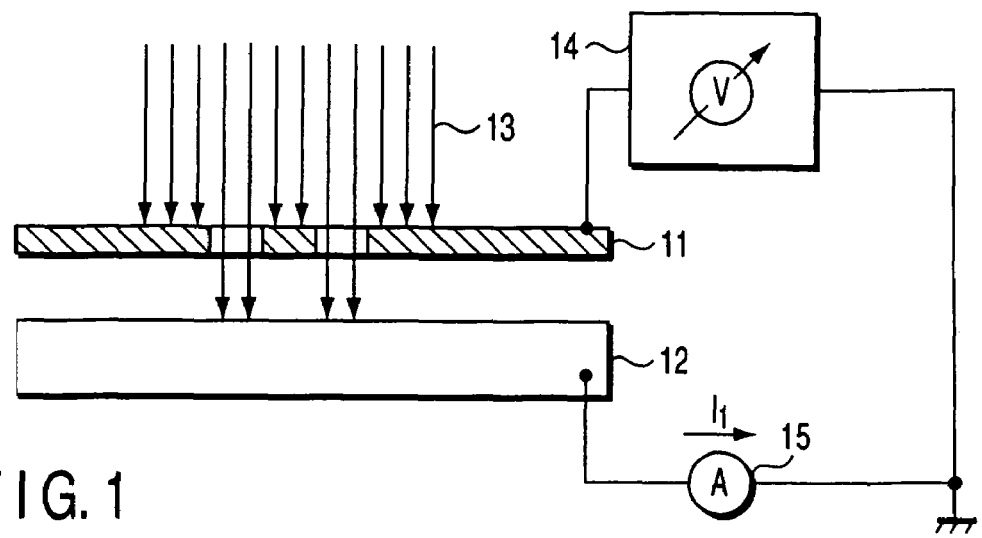
FIG. 1 is a diagram showing part of a semiconductor device manufacturing apparatus according to a first embodiment of the present invention.

FIG. 1 shows a semiconductor manufacturing apparatus according to a first embodiment of the present invention.

In a semiconductor manufacturing process, a stencil mask 11 having a predetermined pattern formed by openings formed in the stencil mask is set above a substrate 12 to be processed at a distance. Charged particles 13 (ion beam) such as ion accelerated by an energy pass through a scanner and a magnet are formulated into a pattern of charged particles. The patterned ion beam 13 is irradiated onto the substrate 12 through the openings formed in the stencil mask. The substrate 12 to be processed mentioned here is a semiconductor substrate, in which a semiconductor device is to be formed or has been formed, not shown.

The stencil mask 11 is connected to a power supply 14 which is also connected to ground. Thus, a potential of the stencil mask 11 can be controlled, with an outer wall of the apparatus or ground as a reference potential. The substrate 12 is connected to the outer wall of the apparatus or ground through an ammeter 15. Thus, current flowing from the substrate can be measured by the ammeter 15.

When the irradiation amount of the ion beam 13 is not changed in a semiconductor manufacturing process such as an ion implantation process, that is, when the quantity of the charged particles applied to the substrate 12 is constant, a current $I_1$ measured by the ammeter 15 is also constant. That is, an appropriate current value for processing condition of processing the substrate 12 exists and the appropriate current value is usually constant. Although most preferably, the constant value of the current $I_1$ is 0(A), it is not restricted to this value but may be other constant value than 0(A).

If electrical balance between the stencil mask 11 and the substrate 12 is get out due to factor variations of the apparatus so that the neutralizing effect is lowered, excessive positive charges may begin to be accumulated on the surface of the substrate 12. The excessive positive charges accumulated on the surface of the substrate 12 flow to the outer wall of the apparatus so that the current $I_1$ increases. Thus, according to this embodiment, the current $I_1$ flowing to the substrate 12 is measured and if the current $I_1$ becomes larger than the appropriate current value for some reason during ion implantation, the positive charges which begin to be accumulated on the substrate 12 can be neutralized by lowering a potential of the stencil mask 11 by the power supply 14. If the potential of the stencil mask 11 is lowered too much when the potential of the stencil mask 11 is adjusted, negative charges are then accumulated on the surface of the substrate 12, and a current $I_2$ becomes smaller than an appropriate current value. The current $I_2$ is a current flowing through the power supply 14. In this case, the negative charges which begin to be accumulated on the substrate 12 can be neutralized by increasing the potential of the stencil mask 11 by the power supply 14.

Thus, according to this embodiment, even if the neutralizing condition changes due to an instable state of the apparatus, in the semiconductor manufacturing process using the charged particles such as ion implantation process, the potential of the stencil mask can be changed following the state of the apparatus. Consequently, the possibility that the semiconductor device may be destroyed due to the charges accumulated on the substrate is reduced, thus yield is improved.

Second Embodiment

Figure 2:
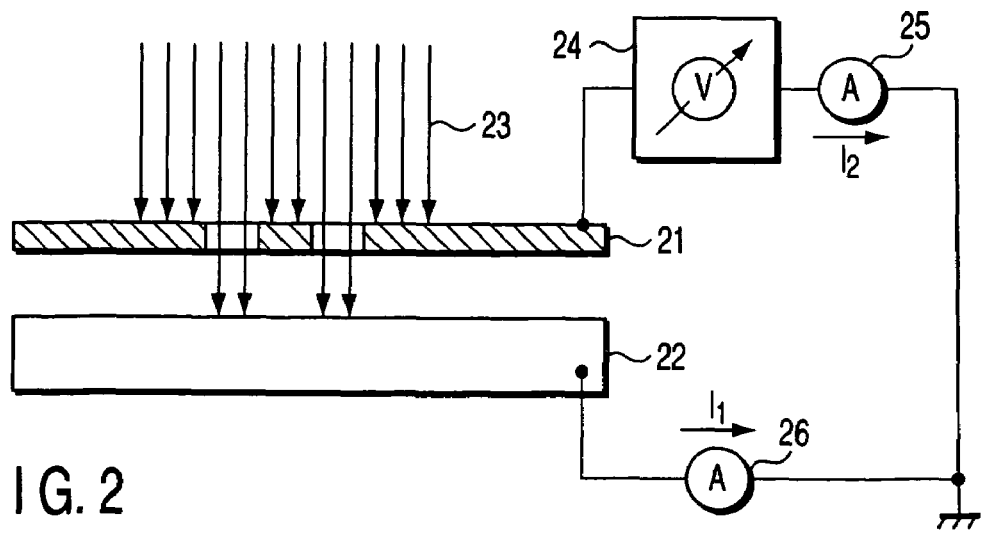
FIG. 2 is a diagram showing part of a semiconductor device manufacturing apparatus according to a second embodiment of the present invention.

FIG. 2 shows a semiconductor manufacturing apparatus according to a second embodiment of the present invention. Reference numerals corresponding to those used in FIG. 1 are attached to the corresponding components, and description thereof is omitted.

In a semiconductor manufacturing process, a stencil mask 21 having a predetermined pattern formed by openings formed in the stencil mask is set above a substrate 22 to be processed at a distance. Charged particles 23 (ion beam) such as ion accelerated by an energy pass through a scanner and a magnet are formulated into a pattern of charged particles. The patterned ion beam 23 is irradiated onto the substrate 22 through the openings formed in the stencil mask. The substrate 22 to be processed mentioned here is a semiconductor substrate, in which a semiconductor device has been formed, not shown.

The stencil mask 21 is connected to a power supply 24 which also is connected to ground (i.e. an outer wall of the apparatus) through an ammeter 25. Thus, a potential of the stencil mask 21 can be controlled, with the outer wall of the apparatus or ground as a reference potential. Further, a current flowing from the stencil mask 21 can be measured by the ammeter 25. The substrate 22 is connected to ground (i.e. an outer wall of the apparatus.) through an ammeter 26. Thus, a current flowing from the substrate can be measured by the ammeter 26.

When the irradiation amount of the ion beam 23 is not changed in a semiconductor manufacturing process such as an ion implantation process, that is, when the quantity of the charged particles applied to the substrate 22 is constant, a current $I_1$ measured by the ammeter 25 is also constant. That is, an appropriate current value for processing condition of processing the substrate 22 exists and that the appropriate current value is usually constant. Although most preferably, the constant value of the current $I_1$ is 0(A), it is not restricted to this value but may be other constant value than 0(A).

However, if the irradiation amount of the ion beam 23 per unit time changes with time in the semiconductor manufacturing process such as an ion implantation process, the quantity of the charged particles applied to the substrate 22 per unit time also changes, so that the current $I_1$ measured with the ammeter 26 also changes. On the other hand, the ratio of the current $I_1$ flowing from the substrate 22 with respect to the current $I_2$ flowing from the stencil mask 21, that is, a current ratio $I_1/I_2$, is constant, since the neutralizing effect is maintained if the electrical balance between a stencil mask 21 and the substrate 22 is stabilized. That is, an appropriate current ratio depending on the processing condition of processing the substrate 22 exists, and usually that value is constant.

If electrical balance between the stencil mask 21 and the substrate 22 is get out due to factor variations of the apparatus so that the neutralizing effect is lowered, excessive positive charges may begin to be accumulated on the surface of the substrate 22. If excessive positive charges begin to be accumulated on the surface of the substrate 22, the ratio of the current $I_1$ flowing from the substrate 22 with respect to the current $I_2$ flowing from the stencil mask 21, that is, the current ratio $I_1/I_2$ is increased. Then, according to this embodiment, the current ratio $I_1/I_2$ is measured and if the current ratio $I_1/I_2$ becomes larger than its appropriate current ratio for some reason in the ion implantation process, the positive charges which begin to be accumulated on the substrate 22 can be neutralized by lowering the potential of the stencil mask 21 through a power supply 24. If the potential is lowered too much when the potential of the stencil mask 21 is adjusted, negative charges are accumulated on the surface of the substrate 22, and the current ratio $I_1/I_2$ becomes smaller than the appropriate current ratio. In this case, the negative charges which begin to be accumulated on the substrate 22 can be neutralized by lowering the potential of the stencil mask 21 by the power supply 24.

Thus, according to this embodiment, even if the irradiation amount of the ion beam changes with time in the semiconductor manufacturing process using the charged particles such as an ion implantation process, yield can be improved by reducing the possibility that the semiconductor device may be destroyed due to the charges accumulated on the substrate.

Third Embodiment

Figure 3:
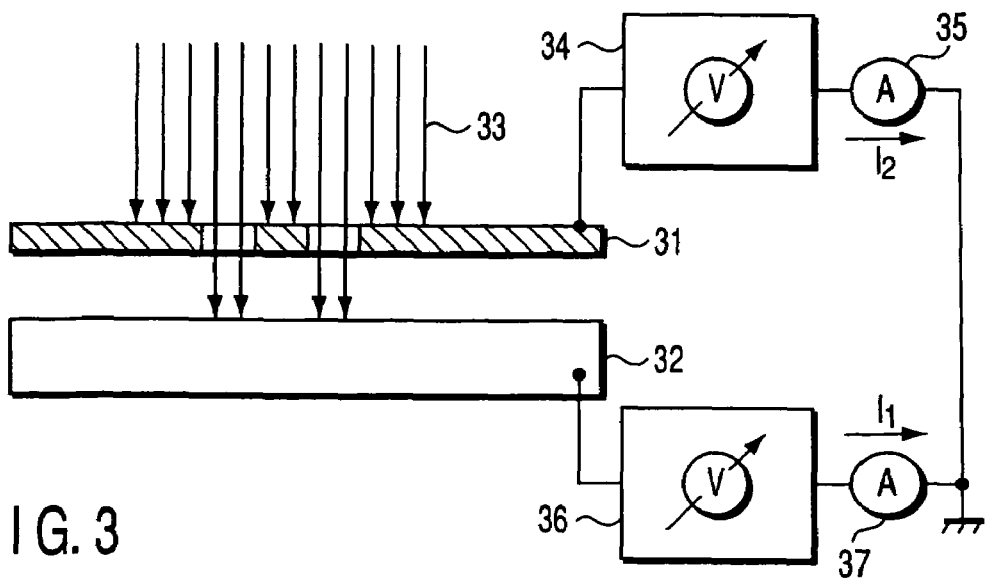
FIG. 3 is a diagram showing part of a semiconductor device manufacturing apparatus according to a third embodiment of the second embodiment.

FIG. 3 shows a semiconductor manufacturing apparatus according to a third embodiment of the present invention. Reference numerals corresponding to those used in FIG. 1 are attached to the corresponding components, and description thereof is omitted.

In a semiconductor manufacturing process, a stencil mask 31 having a predetermined pattern formed by openings formed in the stencil mask is set above a substrate 32 to be processed at a distance. Charged particles 33 (ion beam) such as ion accelerated by an energy pass through a scanner and a magnet are formulated into a pattern of charged particles. The patterned ion beam 33 is irradiated onto the substrate 32 through the openings formed in the stencil mask. The substrate 32 to be processed mentioned here is a semiconductor substrate, in which a semiconductor device has been formed, not shown.

The stencil mask 31 is connected to a power supply 34 which is also is connected to ground (i.e. an outer wall of the apparatus) through an ammeter 35. Thus, a potential of the stencil mask 31 can be controlled, with the outer wall of the apparatus or ground as a reference potential. Further, a current flowing from the stencil mask 31 can be measured by the ammeter 35. The substrate 32 is connected to a power supply 36 which is also is connected to ground (i.e. an outer wall of the apparatus) through an ammeter 37. Thus, a potential of the substrate 32 can be controlled, with the outer wall of the apparatus or ground as a reference potential. Further, a current flowing from the substrate 32 can be measured by the ammeter 37.

When the irradiation amount of the ion beam 33 is not changed in a semiconductor manufacturing process such as an ion implantation process, that is, when the quantity of the charged particles applied to the substrate 32 is constant, a current $I_1$ measured by the ammeter 35 is also constant. That is, an appropriate current value for processing condition of processing the substrate 32 exists and the appropriate current value is usually constant. Although most preferably, the constant value of the current $I_1$ is 0(A), it is not restricted to this value but may be other constant value than 0(A).

However, if the irradiation amount of the ion beam 33 per unit time changes with time in the semiconductor manufacturing process such as an ion implantation process, the quantity of the charged particles applied to the substrate 32 per unit time also changes, so that the current $I_1$ measured with the ammeter 36 also changes. On the other hand, the ratio of the current $I_1$ flowing from the substrate 32 with respect to the current $I_2$ flowing from the stencil mask 31, that is, a current ratio $I_1/I_2$ is constant, since the neutralizing effect is maintained if the electrical balance between a stencil mask 31 and the substrate 32 is stabilized. That is, an appropriate current ratio depending on the processing condition of processing the substrate 32 exists, and usually that value is constant.

If electrical balance between the stencil mask 31 and the substrate 32 is get out due to factor variations of the apparatus so that the neutralizing effect is lowered, excessive positive charges may begin to be accumulated on the surface of the substrate 32. If excessive positive charges begin to be accumulated on the surface of the substrate 32, the ratio of the current $I_1$ flowing from the substrate 32 with respect to the current $I_2$ flowing from the stencil mask 31, that is, the current ratio $I_1/I_2$ is increased. Then, according to this embodiment, the current ratio $I_1/I_2$ is measured and if the current ratio $I_1/I_2$ becomes larger than its appropriate current ratio for some reason in the ion implantation process, the positive charges which begin to be accumulated on the substrate 32 can be neutralized by decreasing the potential difference between the stencil mask 31 and the substrate 32 through power supplies 34, 36. If the potential difference is lowered too much when the potential difference between the stencil mask 31 and the substrate 32 is adjusted, negative charges are then accumulated on the surface of the substrate 32, and the current ratio $I_1/I_2$ becomes smaller than the appropriate current ratio.

According to the present embodiment, the negative charges which begin to be accumulated on the substrate 32 can be neutralized by adjusting the power supplies 34, 36 to thereby increase the potential difference between the stencil mask 31 and the substrate 32. At this time, considering an influence upon the semiconductor device, it is preferable that the power supply 36 connected to the substrate 32 is used as a supplement of the power supply 34. An optimum neutralization can be attained since the potentials of the stencil mask 31 and the substrate 32 can be independently adjusted by using the power supplies 34, 36 connected to the stencil mask 31 and the substrate 32. Thus, according to the present embodiment also, the possibility that the semiconductor device may be destroyed due to the charges accumulated on the substrate is lowered and thus yield can be improved, even if the irradiation amount of the ion beam changes with time in the semiconductor manufacturing process using the charged particles such as ion implantation process.

As described in detail above, according to the embodiments of the present invention, the possibility that the semiconductor device may be destroyed by the charges accumulated on the substrate in the semiconductor manufacturing process using the charged particles such as the ion implantation process can be decreased, thereby improving the yield.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A manufacturing apparatus of a semiconductor device, comprising:
   a stencil mask set above a substrate to be processed in confronting to the substrate, the stencil mask having an opening;
   a particle source which irradiates the substrate to be processed with charged particles through the opening of the stencil mask;
   a first power supply which is connected to the stencil mask and changes a potential of the stencil mask; and
   a first ammeter connected to the substrate to be processed.

2. A semiconductor device manufacturing apparatus, according to claim 1, wherein a second power supply is connected to the substrate for changing a potential of the substrate.

3. A semiconductor device manufacturing apparatus, according to claim 1, wherein the substrate is connected to ground, and the first power supply changes the potential of the stencil mask with ground as a reference potential.

4. A semiconductor device manufacturing apparatus, according to claim 1, wherein a second ammeter is connected to the stencil mask.

5. A semiconductor device manufacturing apparatus, according to claim 4, wherein a second power supply is connected to the substrate for changing a potential of the substrate.

* * * * *